United States Patent
Fujita et al.

(10) Patent No.: US 6,480,075 B1
(45) Date of Patent: Nov. 12, 2002

(54) SURFACE ACOUSTIC WAVE FILTER

(75) Inventors: Masayuki Fujita, Kyoto (JP); Toshiharu Tanaka, Kadoma (JP)

(73) Assignees: Sanyo Electric Co., Ltd., Osaka (JP); Sanyo Electronic Components Co., Ltd., Osaka (JP)

( * ) Notice: Subject to any disclaimer, the term of this patent is extended or adjusted under 35 U.S.C. 154(b) by 0 days.

(21) Appl. No.: 09/539,520

(22) Filed: Mar. 30, 2000

(30) Foreign Application Priority Data

Mar. 31, 1999 (JP) .......................................... 11-093419

(51) Int. Cl.[7] ................................................ H03H 9/64
(52) U.S. Cl. ...................................... 333/193; 333/195
(58) Field of Search ................................ 333/193, 194, 333/195

(56) References Cited

U.S. PATENT DOCUMENTS

| | | | | |
|---|---|---|---|---|
| 5,471,178 A | * | 11/1995 | Hickernell | .................. 333/193 |
| 5,789,845 A | * | 8/1998 | Wadaka et al. | ............. 310/334 |
| 5,973,579 A | * | 10/1999 | Asakawa et al. | ........... 333/168 |

FOREIGN PATENT DOCUMENTS

| | | |
|---|---|---|
| JP | 52-48452 | 4/1977 |
| JP | 53-105156 | 9/1978 |
| JP | 5-183380 | 7/1993 |
| JP | 8-37438 | 2/1996 |
| JP | 08340232 | 12/1996 |
| JP | 08340234 | 12/1996 |
| JP | 11-340783 | 12/1999 |

* cited by examiner

*Primary Examiner*—Robert Pascal
*Assistant Examiner*—Dean Takaoka
(74) *Attorney, Agent, or Firm*—Rader, Fishman & Grauer PLLC

(57) ABSTRACT

The invention provides a three-stage surface acoustic wave filter of the ladder type wherein the resonance frequency difference $\Delta f_2$ between the resonance frequency $f_{rs2}$ of a serial resonator in an intermediate stage and the resonance frequency $f_{rp2}$ of a parallel resonator therein is set at a value greater than the resonance frequency difference $\Delta f_1$ ($\Delta f_3$) between the resonance frequency $f_{rs1}$ ($f_{rs3}$) of a serial resonator in each of front and rear stages and the resonance frequency $f_{rp1}$ ($f_{rp3}$) of a parallel resonator therein, whereby the filter is given a widened pass band while reliably retaining satisfactory characteristics comparable to those of conventional surface acoustic wave filters of small pass band width. The desired filter exhibiting such performance is available within a shorter period of time and with reduced labor.

2 Claims, 4 Drawing Sheets

PAIR OF THE ELECTRODE FINGERS

SURFACE ACOUSTIC WAVE FILTER

FIELD OF THE INVENTION

The present invention relates to three-stage surface acoustic wave filters of the ladder type comprising three serial resonators connected to a serial line and three parallel resonators connected to parallel lines.

BACKGROUND OF THE INVENTION

Surface acoustic wave filters are conventionally used as resonator filters in communications devices such as portable telephones.

For example, FIG. 3 shows a surface acoustic wave filter comprising three serial resonators 6a, 6b, 6c connected to a serial line 4 of a ladder-type circuit and three parallel resonators 7a, 7b, 7c connected to respective parallel lines 5 of the circuit. The three serial resonators 6a, 6b, 6c have respective resonance frequencies $f_{rs1}$, $f_{rs2}$, $f_{rs3}$ which are of the same value, and the three parallel resonators 7a, 7b, 7c have respective resonance frequencies $f_{rp1}$, $f_{rp2}$, $f_{rp3}$ which are of the same value. The resonance frequency differences $\Delta f_1$, $\Delta f_2$, $\Delta f_3$ between the resonance frequencies of the serial resonators and those of the corresponding parallel resonators are of the same value.

As shown in FIG. 4, each of the serial resonators 6a, 6b, 6c comprises an interdigital electrode 2 and grating reflectors 3, 3 which are formed on the surface of a piezoelectric substrate 1. The parallel resonators 7a, 7b, 7c are identical with the serial resonators 6a, 6b, 6c in construction.

In recent years, there is a demand for surface acoustic wave filters having a greater pass band width for use in portable telephones.

Accordingly it is attempted to give a wider pass band by increasing the resonance frequency differences $\Delta f_1 \Delta f_2$, $\Delta f_3$ between the resonance frequencies $f_{rs1}$, $f_{rs2}$, $f_{rs3}$ of the serial resonators 6a, 6b, 6c shown in FIG. 3 and the resonance frequencies $f_{rp1}$, $f_{rp2}$, $f_{rp3}$ of the corresponding parallel resonators 7a, 7b, 7c shown.

However, setting the three resonance frequency differences at an increased value produces adverse effects on the characteristics of the surface acoustic wave filter as will be described below.

FIG. 5 shows the VSWR (voltage standing wave ratio) and insertion loss characteristics of surface acoustic wave filters at varying frequencies. The VSWR-frequency characteristics and insertion loss-frequency characteristics of a surface acoustic wave filter having a pass band of relatively small width are represented by a thin solid line and thick solid line, respectively. The VSWR-frequency characteristics and insertion loss-frequency characteristics of a surface acoustic wave filter having increased resonance frequency differences are represented by a thin broken line and thick broken line, respectively. It is desired that the VSWR be small in the pass band.

As indicated by an arrow (1), the filter having increased resonance frequency differences is greater in VSWR within the pass band than the filter having a small pass band width.

The filter of small pass band width exhibits an insertion loss characteristics curve which is generally flat and relatively small in ripple within the pass band, while the filter of great resonance frequency differences exhibits an insertion loss characteristics curve which has a furrow around the center frequency $f_0$ as indicated by an arrow (2) and is increased in ripple value.

Further the insertion loss characteristics curve of the filter of small pass band width has an approximately constant great slope in the entire boundary frequency band between the pass band and the lower-frequency outer side thereof, exhibiting satisfactory cut-off characteristics, whereas the insertion loss characteristics curve of the filter of great resonance frequency differences has a gentle slope at a portion of the boundary frequency band as indicated by an arrow (3), hence impaired cut-off characteristics.

In order to obtain a filter which is widened in pass band while retaining satisfactory characteristics comparable to those of the conventional surface acoustic wave filter of small pass band width, a method is used of optimizing parameters such as the above-mentioned resonance frequency differences, the capacitances of the resonators which are dependent on the number of pair of the electrode fingers and aperture width of each resonator, and the capacitance ratio of the serial resonators to the parallel resonators (JP-A No. 340232/1996 and JP-A No. 340234/1996).

However, this method of optimizing the resonance frequency differences, capacitances of the resonators, etc. involves many parameters which need to be adjusted, requires repeated fabrication of a large number of filters for experiments and therefore has the problem of necessitating much time and labor before a surface acoustic wave filter of desired performance is obtained.

The surface acoustic wave filter obtained by the above method can be reduced to not greater than specified values in insertion loss, ripple and VSWR value within the pass band, whereas the filter involves the problem that the insertion loss characteristics curve thereof has a gentle slope in a portion of the boundary frequency band between the pass band and the lower-frequency outer side thereof, hence impaired cut-off characteristics and unsatisfactory filter characteristics.

SUMMARY OF THE INVENTION

An object of the present invention is to provide a three-stage surface acoustic wave filter of the ladder type which is widened in pass band while reliably retaining satisfactory characteristics comparable to those of the conventional surface acoustic wave filter of small pass band width, and to reduce the time and labor required for fabricating the desired filter having such characteristics.

Accordingly, we have conducted intensive research to fulfill the above object and accomplished the present invention based on the finding that making the stages of the filter different in the resonance frequency difference between the resonance frequency of the serial resonator of the stage and the resonance frequency of the parallel resonator thereof influences the width of the pass band and characteristics of the filter.

The present invention provides a three-stage surface acoustic wave filter of the ladder type which comprises three serial resonators connected to a serial line and three parallel resonators connected to parallel lines, and wherein the resonance frequency difference $\Delta f_2$ between the resonance frequency $f_{rs2}$ of the serial resonator in the intermediate stage and the resonance frequency $f_{rp2}$ of the parallel resonator in the intermediate stage is set at a value greater than the resonance frequency difference $\Delta f_1$ ($\Delta f_3$) between the resonance frequency $f_{rs1}$ ($f_{rs3}$) of the serial resonator in each of the front and rear stages and the resonance frequency $f_{rp1}$ ($f_{rp3}$) of the parallel resonator therein.

With the surface acoustic wave filter of the present invention, the resonance frequency difference $\Delta f_2$ of the intermediate stage is made greater than the resonance frequency difference $\Delta f_1$ ($\Delta f_3$) of each of the front and rear stages, whereby the filter is given a greater pass bandwidth than in the prior art. The filter of the present invention has a VSWR reduced to as small a value as in the prior art within the pass band and an insertion loss characteristics curve which is generally flat in the pass band with ripple suppressed to as small a value as in the prior art and which has an approximately constant great slope in the entire boundary frequency band between the pass band and the outside thereof, hence satisfactory cut-off characteristics. Thus, the filter of the invention reliably retains satisfactory characteristics comparable to those of the conventional surface acoustic wave filter of small pass band width. Experiments have substantiated that the present filter has a greater pass band width than the conventional filter and is as satisfactory as the conventional one in characteristics.

The parameters which need to be adjusted to provide the filter of the invention thus constructed are limited to six, i.e., the resonance frequencies $f_{rs1}$ to $f_{rs3}$ and $f_{rp1}$ to $f_{rp3}$ of the serial and parallel resonators. This reduces the number of filters to be fabricated for experiments unlike the conventional method described which requires the adjustment of parameters, such as the capacitances of the resonators and capacitance ratio, other than the resonance frequencies of the resonators. As a result, the desired surface acoustic wave filter is available within a shorter period of time and with reduced labor.

Stated more specifically, the ratio of the resonance frequency difference $\Delta F$ between the resonance frequency difference $\Delta f_2$ of the intermediate stage and the resonance frequency difference $\Delta f_1$ ($\Delta f_3$) of each of the front and rear stages to the center frequency $f_0$ (hereinafter referred to merely as the "frequency difference ratio") should be in the range defined by Mathematical Expression 1 given below.

$$0 < \Delta F/f_0 < 0.02 \quad \text{(Mathematical Expression 1)}$$

When the frequency difference ratio is greater than 0, the filter can be given a wider pass band while retaining characteristics comparable to those of the conventional filter.

If the frequency difference ratio is not smaller than 0.02, on the other hand, the insertion loss outside the pass band diminishes to result in lower ability to suppress noise.

It is therefore desired that the frequency difference ratio be in the above range.

More preferably, the frequency difference ratio should be a value defined by Mathematical Expression 2 given below.

$$\Delta F/f_0 = 0.01 \quad \text{(Mathematical Expression 2)}$$

According to the present invention, a three-stage surface acoustic wave filter of the ladder type is available which is given a widened pass band while reliably retaining satisfactory characteristics comparable to those of the conventional surface acoustic wave filter of small pass band width.

Furthermore, the invention reduces the time and labor required for obtaining the desired surface acoustic wave filter exhibiting such performance.

DETAILED DESCRIPTION OF EMBODIMENT

An embodiment of the invention will be described below in detail with reference to the drawings.

Figure 3:
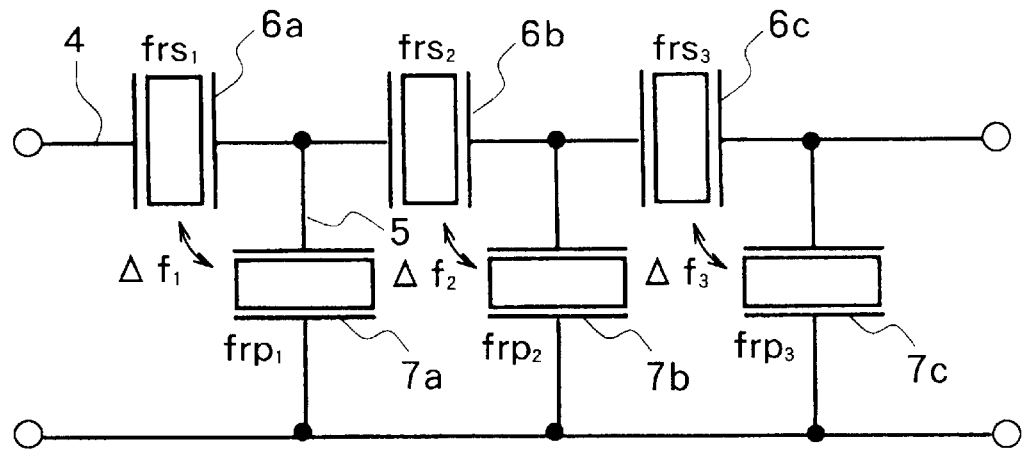
FIG. 3 is a diagram showing the basic construction of a three-stage surface acoustic wave filter of the ladder type.
Figure 4:
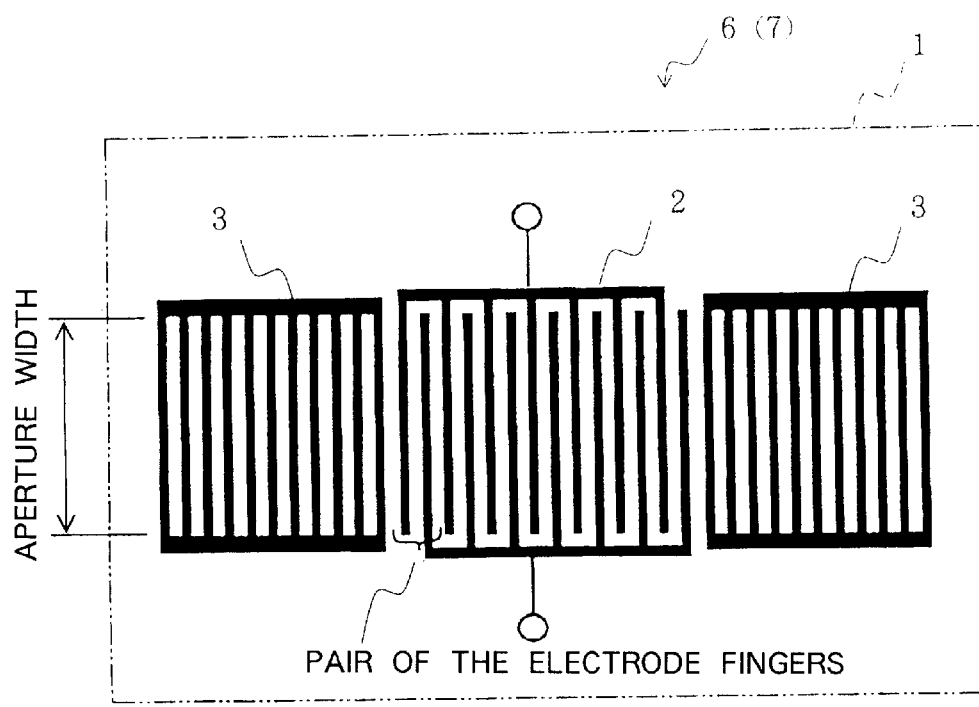
FIG. 4 is a diagram showing the electrode construction of a one-port resonator.
Figure 5:
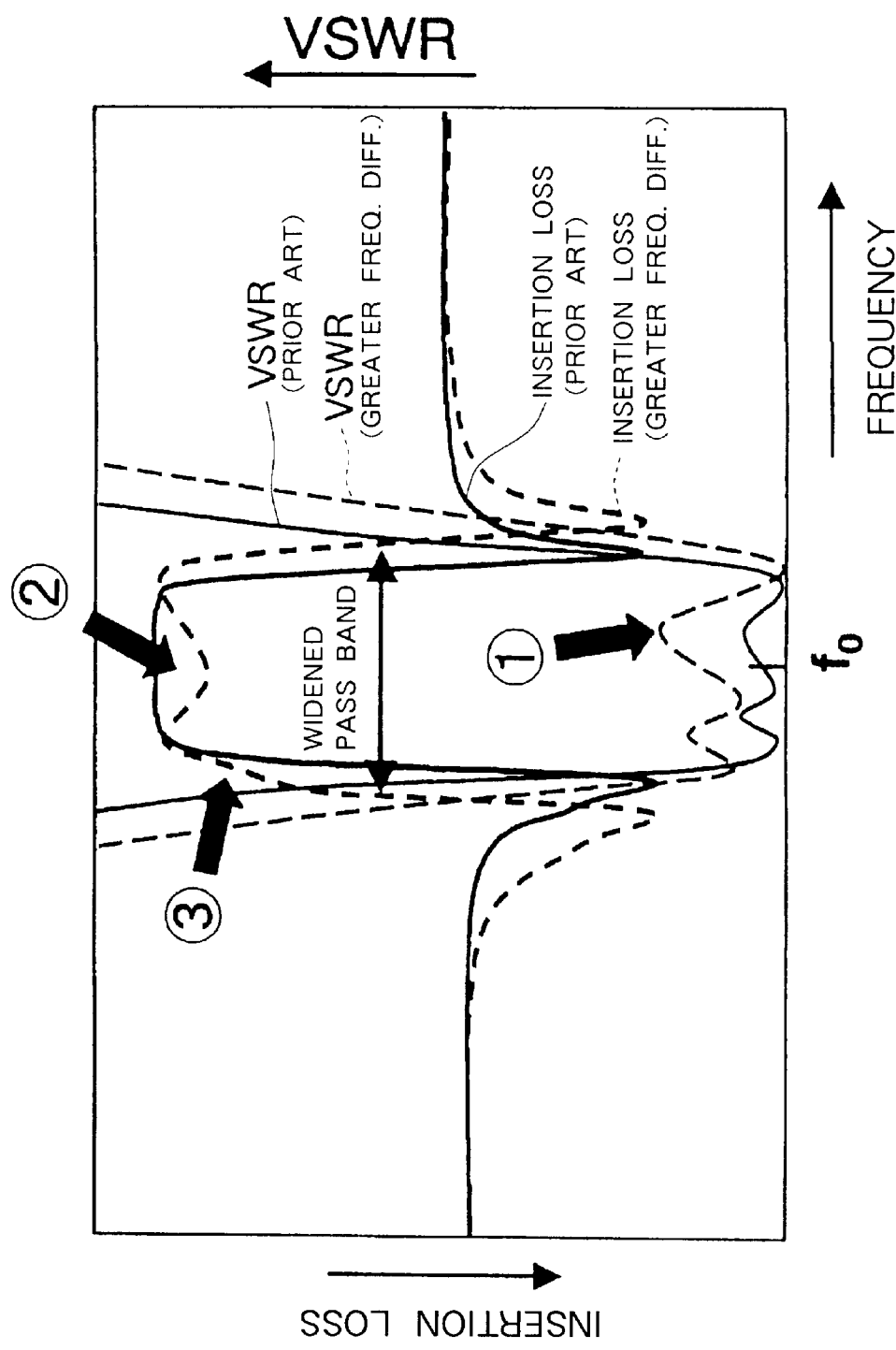
FIG. 5 is a graph showing the VSWR and insertion loss characteristics of conventional surface acoustic wave filters at varying frequencies.

The present invention provides a surface acoustic wave filter which comprises three serial resonators 6a, 6b, 6c connected to a serial line 4 of a ladder-type circuit and three parallel resonators 7a, 7b, 7c connected respectively to parallel lines 5 of the circuit as shown in FIG. 3. With reference to FIG. 4, each of the serial resonators 6a, 6b, 6c comprises an interdigital electrode 2 and a pair of grating reflectors 3, 3 which are formed on a substrate 1. The parallel resonators 7a, 7b, 7c are identical with the serial resonators 6a, 6b, 6c in construction.

With the surface acoustic wave filter of the invention, the resonance frequency difference $\Delta f_2$ between the resonance frequency $f_{rs2}$ of the serial resonator 6b in the intermediate stage and the resonance frequency $f_{rp2}$ of the parallel resonator 7b therein is set at a value greater than the resonance frequency difference $\Delta f_1$ ($\Delta f_3$) between the resonance frequency $f_{rs1}$ ($f_{rs3}$) of the serial resonator 6a (6c) in each of the front and rear stages and the resonance frequency $f_{rp1}$ ($f_{rp3}$) of the parallel resonator 7a (7c) therein. The ratio of the resonance frequency difference $\Delta F$ between the resonance frequency difference $\Delta f_2$ of the intermediate stage and the resonance frequency difference $\Delta f_1$ ($\Delta f_3$) of each of the front and rear stages to the center frequency $f_0$ (frequency difference ratio) is set, for example, at 0.01. In the following description, the resonance frequency differences $\Delta f_1$, $\Delta f_2$, $\Delta f_3$ between the resonance frequencies $f_{rs1}$, $f_{rs2}$, $f_{rs3}$ of the serial resonators 6a, 6b, 6c and the resonance frequencies $f_{rp1}$, $f_{rp2}$, $f_{rp3}$ of the corresponding parallel resonators 7a, 7b, 7c will be referred to merely as the "resonance frequency differences."

The surface acoustic wave filter of the invention is as satisfactory as the conventional surface acoustic wave filter of small pass band width in characteristics and has a wider pass band than the conventional one.

The parameters which need to be adjusted according to the invention to set the resonance frequency difference ratio to 0.01 as described above are limited to six, i.e., the resonance frequencies $f_{rs1}$ to $f_{rs3}$ and $f_{rp1}$ to $f_{rp3}$ of the resonators 6a to 6c and 7a to 7c shown in FIG. 3. This reduces the number of filters to be fabricated for experiments unlike the conventional method which requires the adjustment, for example, of the capacitances of the resonators and the capacitance ratio of the serial resonators 6a to 6c to the parallel resonators 7a to 7c, in addition to the adjustment of resonance frequencies of the resonators. As a result, the desired surface acoustic wave filter is available within a shorter period of time and with reduced labor.

Next, a description will be given of the results of experiments conducted t6 determine an optimum range of frequency difference ratios.

Table 1 shows the resonance frequencies of the resonators included in the various surface acoustic wave filters used for the experiments. All the serial resonators were 77 in the number of pairs of the electrode fingers, 50% in duty ratio (percentage of the electrode digit width relative to the electrode digit pitch) and 80 μm in aperture width. All the parallel resonators were 37 in the number of pairs of the electrode fingers, 50% in duty ratio and 170 μm in aperture width.

|  | EXAMPLE 1 | | EXAMPLE 2 | |
|---|---|---|---|---|
| CONDITION | RESONANCE FREQUENCIES (f, MHz) | RESONANCE FREQ. DIFF. (Δ f, MHz) | RESONANCE FREQUENCIES (f, MHz) | RESONANCE FREQ. DIFF. (Δ f, MHz) |
| FRONT STAGE | 970/930 | 40 | 970/930 | 40 |
| INTERMEDIATE STAGE | 975/925 | 50 | 980/920 | 60 |
| REAR STAGE | 970/930 | 40 | 970/930 | 40 |
| FREQUENCY DIFFERENCE | 10 (0.01)* | | 20 (0.02) | |

|  | COMPARATIVE EXAMPLE 1 | | COMPARATIVE EXAMPLE 2 | |
|---|---|---|---|---|
| CONDITION | RESONANCE FREQUENCIES (f, MHz) | RESONANCE FREQ. DIFF. (Δ f, MHz) | RESONANCE FREQUENCIES (f, MHz) | RESONANCE FREQ. DIFF. (Δ f, MHz) |
| FRONT STAGE | 970/930 | 40 | 970/930 | 40 |
| INTERMEDIATE STAGE | 970/930 | 40 | 985/915 | 70 |
| REAR STAGE | 970/930 | 40 | 970/930 | 40 |
| FREQUENCY DIFFERENCE | 0 (0.00) | | 30 (0.03) | |

*PARENTHESIZED IS A VALUE NORMALIZED BY THE CENTER FREQUENCY (AVERAGE OF THE RESONANCE FREQUENCIES OF RESONATORS CONNECTED IN SERIES AND PARALLEL).

EXAMPLE 1

With reference to Table 1 given above, the surface acoustic wave filter of Example 1 had the construction of FIG. 3, in which the resonance frequencies $f_{rs1}$, $f_{rs3}$ of the serial resonators 6a, 6c in the front and rear stages were 970 MHz, the resonance frequencies $f_{rp1}$, $f_{rp3}$ of the parallel resonators 7a, 7c in these stages were 930 MHz and the resonance frequency differences $\Delta f_1$, $\Delta f_3$ of the front and rear stages were 40 MHz, while the resonance frequency $f_{rs2}$ of the serial resonator 6b in the intermediate stage was 975 MHz, the resonance frequency $f_{rp2}$ of the parallel resonator 7b in this stage was 925 MHz and the resonance frequency difference $\Delta f_2$ of the intermediate stage was 50 MHz. As a result, the resonance frequency difference ΔF between the resonance frequency difference $\Delta f_2$ of the intermediate stage and the resonance frequency difference $\Delta f_1$ ($\Delta f_3$) of each of the front and rear stages was 10 MHz, and the frequency difference ratio was 0.01.

EXAMPLE 2

With reference to Table 1 given above, the surface acoustic wave filter of Example 2 had the construction of FIG. 3, in which the resonance frequencies $f_{rs1}$, $f_{rs3}$ Of the serial resonators 6a, 6c in the front and rear stages were 970 MHz, the resonance frequencies $f_{rp1}$, $f_{rp3}$ of the parallel resonators 7a, 7c in these stages were 930 MHz and the resonance frequency differences $\Delta f_1$, $\Delta f_3$ of the front and rear stages were 40 MHz, while the resonance frequency $f_{rs2}$ of the serial resonator 6b in the intermediate stage was 980 MHz, the resonance frequency $f_{rp2}$ of the parallel resonator 7b in this stage was 920 MHz and the resonance frequency difference $\Delta f_2$ of the intermediate stage was 60 MHz. As a result, the resonance frequency difference ΔF between the resonance frequency difference $\Delta f_2$ of the intermediate stage and the resonance frequency difference $\Delta f_1$ ($\Delta f_3$) of each of the front and rear stages was 20 MHz, and the frequency difference ratio was 0.02.

COMPARATIVE EXAMPLE 1

With reference to Table 1 given above, the surface acoustic wave filter of Comparative Example 1 had the construction of FIG. 3, in which the resonance frequencies $f_{rs1}$, $f_{rs2}$, $f_{rs3}$ of the serial resonators 6a, 6b, 6c in the three stages were 970 MHz, the resonance frequencies $f_{rp1}$, $f_{rp2}$, $f_{rp3}$ of the parallel resonators 7a, 7b, 7c in these stages were 930 MHz and the resonance frequency differences $\Delta f_1$, $\Delta f_2$, $\Delta f_3$ of the three stages were 40 MHz. As a result, the resonance frequency difference ΔF between the resonance frequency difference $\Delta f_2$ of the intermediate stage and the resonance frequency difference $\Delta f_1$ ($\Delta f_3$) of each of the front and rear stages was 0 MHz, and the frequency difference ratio was 0.

COMPARATIVE EXAMPLE 2

With reference to Table 1 given above, the surface acoustic wave filter of Comparative Example 2 had the construction of FIG. 3, in which the resonance frequencies $f_{rs1}$, $f_{rs3}$ of the serial resonators 6a, 6c in the front and rear stages were 970 MHz, the resonance frequencies $f_{rp1}$, $f_{rp3}$ of the parallel resonators 7a, 7c in these stages were 930 MHz and the resonance frequency differences $\Delta f_1$, $\Delta f_3$ of the front and rear stages were 40 MHz, while the resonance frequency $f_{rs2}$ of the serial resonator 6b in the intermediate stage was 985 MHz, the resonance frequency $f_{rp2}$ of the parallel resonator 7b in this stage was 915 MHz and the resonance frequency difference $\Delta f_2$ of the intermediate stage was 70 MHz. As a result, the resonance frequency difference ΔF between the resonance frequency difference $\Delta f_2$ of the intermediate stage and the resonance frequency difference $\Delta f_1$ ($\Delta f_3$) of each of the front and rear stages was 30 MHz, and the frequency difference ratio was 0.03.

Figure 1:
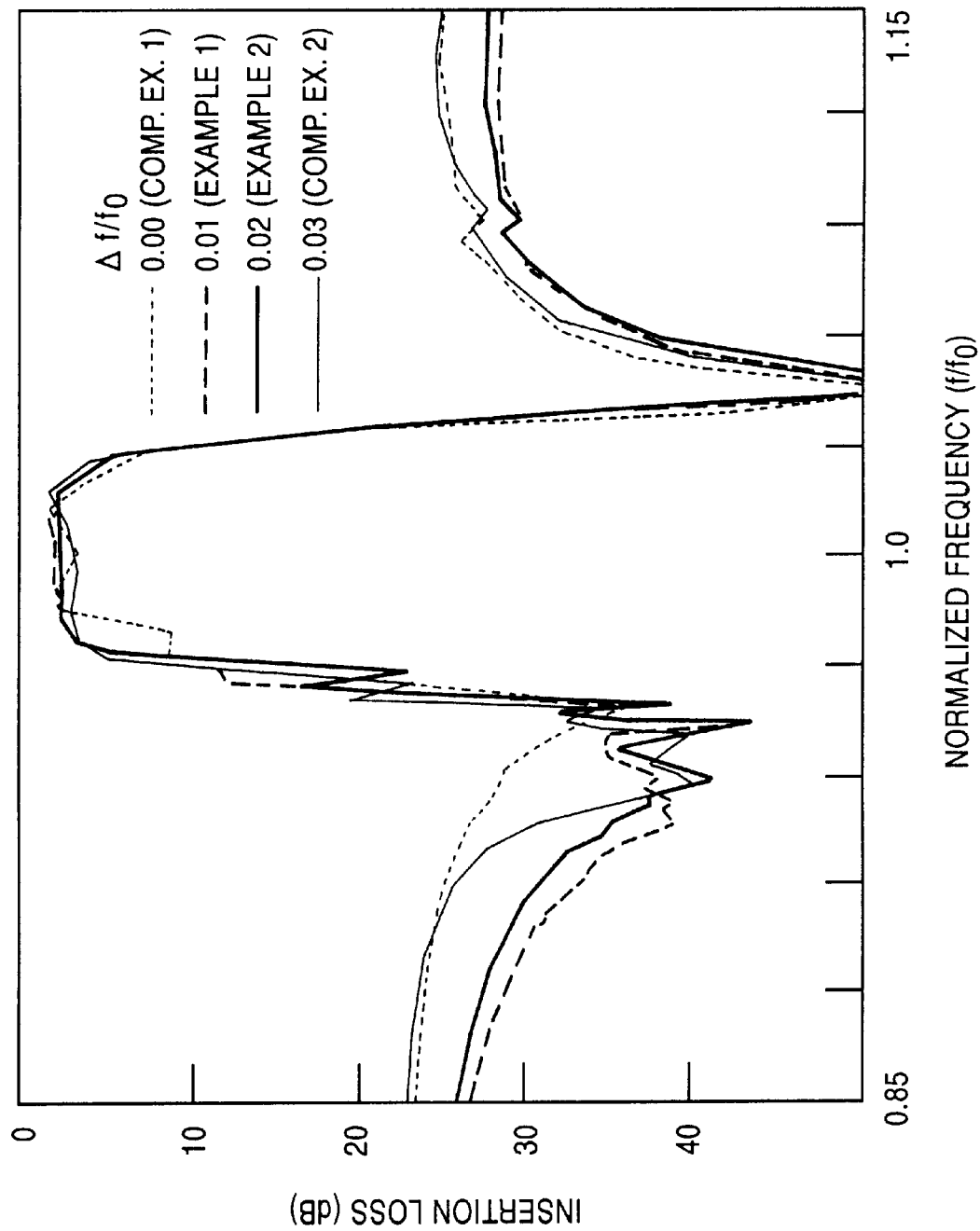
FIG. 1 is a graph showing the insertion loss-frequency characteristics of surface acoustic wave filters of the invention.
Figure 2:
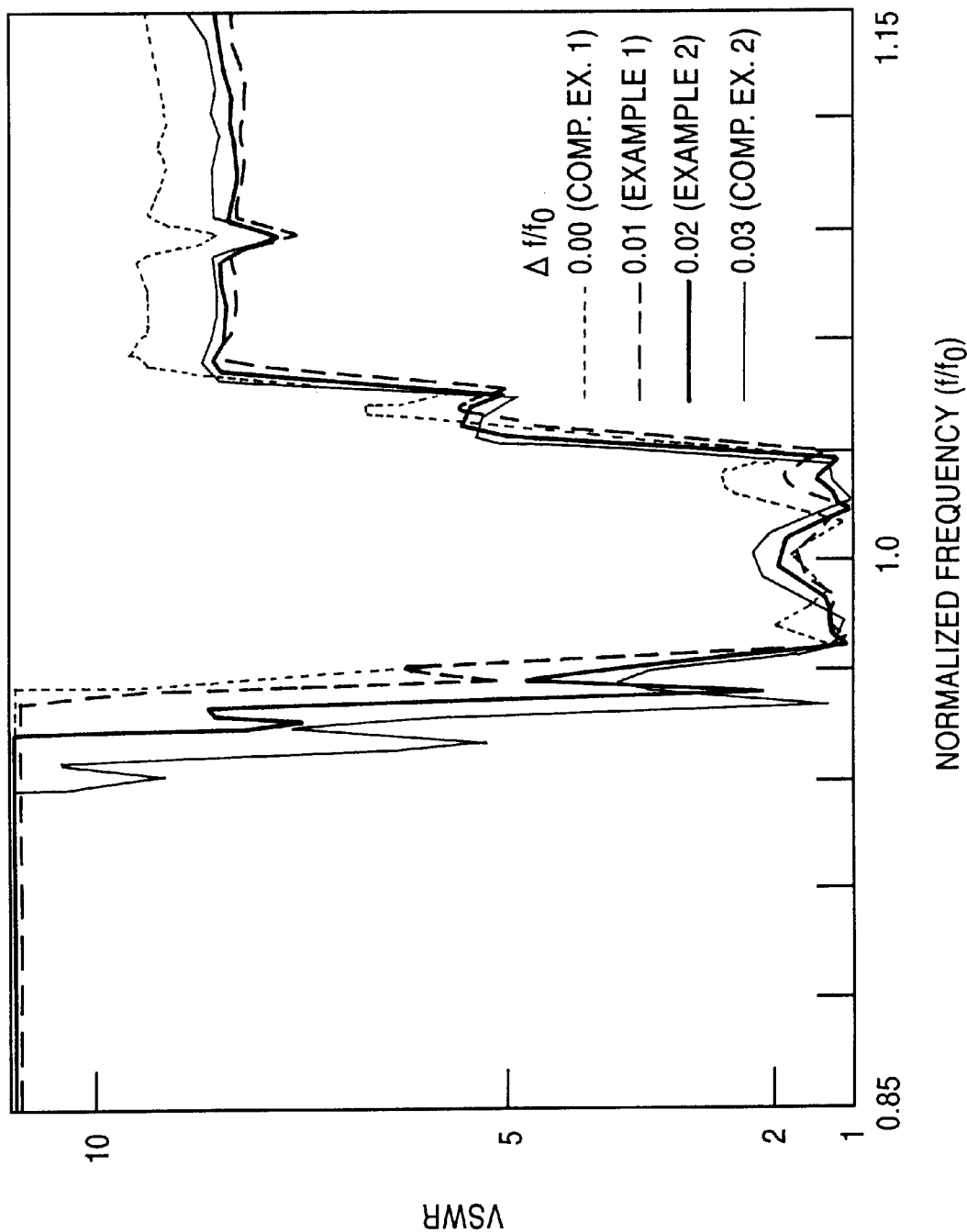
FIG. 2 is a graph showing the VSWR-frequency characteristics of the surface acoustic wave filters of the invention.

FIG. 1, FIG. 2 and Table 3 given below show the insertion loss-frequency characteristics and VSWR-frequency characteristics of the surface acoustic wave filters described above.

| FREQUENCY DIFFERENCE RATIO | 0.00 (COMP. EX. 1) | 0.01 (EXAMPLE 1) | 0.02 (EXAMPLE 2) | 0.03 (COMP. EX. 2) |
|---|---|---|---|---|
| INSERTION LOSS* (dB) (IN PASS BAND) | 1.5 | 1.5 | 1.5 | 1.5 |
| SLOPE** (dB/MHz) | 0.6 | 1.5 | 0.8 | 0.65 |
| VSWR (MAX. IN PASS BAND) | 1.8 | 2.0 | 2.2 | 2.5 |
| RIPPLE | 1.5 | 1.5 | 1.5 | 1.8 |
| INSERTION LOSS (dB) (OUTSIDE OF PASS BAND) | 24 | 28 | 26 | 23 |

*MINIMUM IN THE PASS BAND (PREDETERMINED PASS BAND: ±18 MHz = ±0.018F0)
**SLOPE OF THE PASS BAND SHOULDER (BETWEEN 0.96f0 AND 0.97f0)

Table 2 reveals that Comparative Example 2, Example 1 and Example 2 are the same as Comparative Example 1 in the minimum value of insertion loss within the pass band.

On the other hand, Examples 1 and 2 are greater than Comparative Example 1 in the minimum value of insertion loss outside the pass band. However, Comparative Example 2 is smaller than Comparative Example 1 in this value and lower in noise suppressing ability. It is accordingly desired that from the viewpoint of suppression of noise, the frequency difference ratio be in the range of 0 to 0.02, more preferably 0.01.

With respect to the slope in a portion of the boundary frequency band between the pass band and the lower-frequency outer side thereof, Table 2 reveals that Comparative Example 2 is comparable to Comparative Example 1, but that Examples 1 and 2 are greater than Comparative Example 1, exhibiting satisfactory cut-off characteristics. From the viewpoint of cut-off characteristics, therefore, it is desired that the frequency difference ratio be in the range of 0 to 0.02.

Table 2 further indicates that with respect to the ripple within the pass band, Comparative Example 2 is greater than Comparative Example 1, but that Examples 1 and 2 show the same value as Comparative Example 1. FIG. 1 reveals that the insertion loss characteristics curve of Comparative Example 2 has a furrow in the pass band as is the case with Comparative Example 1, while indicating that the insertion loss characteristics curves of Examples 1 and 2 are generally flat in the pass band. From the viewpoint of ripple, therefore, it is desired that the frequency difference ratio be in the range of 0 to 0.02.

Table 2 and FIG. 2 further show that Examples 1 and 2 and Comparative Example 2 are greater than Comparative Example 1 in the maximum value of VSWR in the pass band, while it is desired that the value of VSWR be up to 2.0 since the allowable range of VSWR values of surface acoustic wave filters is less than 2.5. From the viewpoint of VSWR, it is accordingly desirable that the frequency difference ratio be in the range of 0 to 0.02, more preferably 0.01.

The foregoing results indicate that it is desirable to set the frequency difference ratio at a value greater than 0 to less than 0.02, more desirably at 0.01.

What is claimed is:

1. A three-stage surface acoustic wave filter of the ladder type comprising three serial resonators connected to a serial line and three parallel resonators connected to parallel lines, the filter being characterized in that the resonance frequency difference between the resonance frequency of the serial resonator in an intermediate stage and the resonance frequency of the parallel resonator therein is set at a value greater than the resonance frequency difference between the resonance frequency of the serial resonator in each of front and rear stages and the resonance frequency of the parallel resonator therein, and the ratio of the resonance frequency difference $\Delta F$ between the resonance frequency difference of the intermediate stage and the resonance frequency difference of each of the front and rear stages to the center frequency $f_0$ is in the range defined by the mathematical expression of:

$$0 < \Delta F/f_0 < 0.02.$$

2. A surface acoustic wave filter according to claim 1 wherein the ratio of the resonance frequency difference $\Delta F$ between the resonance frequency difference of the intermediate stage and the resonance frequency difference of each of the front and rear stages to the center frequency $f_0$ is a value defined by the mathematical expression of:

$$\Delta F/f_0 = 0.01$$

* * * * *